United States Patent [19]

Iesaka et al.

[11] Patent Number: 4,476,154
[45] Date of Patent: Oct. 9, 1984

[54] METHOD OF MANUFACTURING A GLASS PASSIVATION SEMICONDUCTOR DEVICE

[75] Inventors: Susumu Iesaka, Tokyo; Shigenori Yakushizi, Yokohama, both of Japan

[73] Assignee: Tokyo Shibaura Denki Kabushiki Kaisha, Japan

[21] Appl. No.: 373,731

[22] Filed: Apr. 30, 1982

[30] Foreign Application Priority Data

Jun. 29, 1981 [JP] Japan .................................. 56-99599

[51] Int. Cl.$^3$ ........................ B05D 3/06; B05D 5/12; B44C 1/22; C03C 15/00
[52] U.S. Cl. .................................... 427/53.1; 156/657; 156/662; 427/93; 427/126.2; 427/380
[58] Field of Search ...................... 427/53.1, 93, 126.2, 427/380; 156/657, 662

[56] References Cited

FOREIGN PATENT DOCUMENTS

| | | | |
|---|---|---|---|
| 51-151071 | 12/1976 | Japan . | |
| 55-36184 | 9/1980 | Japan . | |
| 55-148430 | 11/1980 | Japan . | |
| 71945 | 6/1981 | Japan | 427/53.1 |
| 56-42138 | 10/1981 | Japan . | |

Primary Examiner—Michael R. Lusignan
Attorney, Agent, or Firm—Finnegan, Henderson, Farabow, Garrett & Dunner

[57] ABSTRACT

A method of manufacturing a glass passivation semiconductor device by depositing a glass passivation layer on the surface of a semiconductor junction formed on a semiconductor substrate. First laser beams which can be substantially absorbed in the glass protective material and second laser beams which can be absorbed in the semiconductor substrate are simultaneously irradiated on those portions of the semiconductor substrate on which the glass protective material is deposited, thereby providing a glass passivation layer.

4 Claims, 7 Drawing Figures

METHOD OF MANUFACTURING A GLASS PASSIVATION SEMICONDUCTOR DEVICE

BACKGROUND OF THE INVENTION

This invention relates to a method of manufacturing a glass passivation semiconductor device including the step of depositing a glass passivation layer on the surface of a semiconductor junction by applying laser beams.

Recently, glass is used as a protective layer instead of silicon rubber in order to assure the electric stability of the surface of a semiconductor junction of a semiconductor device. This glass protective layer is prepared, for example, from borosilicate glass. Such glass protective layer prevents the seeping of water or the permeation of a harmful impurity, for example, Na ion.

To date, laser beams have been applied to deposit the above-mentioned glass passivation layer. A description is now given with reference to FIGS. 1 and 2 of a process of forming the layer. As illustrated in FIG. 1, metal electrodes 18 and a metal electrode 20 are respectively mounted on opposite sides of a silicon wafer 10 formed of, for example, a P+ layer 12, N− layer 14 and N+ layer 16. The metal electrodes 18 are applied as diode cathodes, and the metal electrode 20 as a diode anode.

The wafer 10 is later subjected to mesa etching to provide mesa grooves 22, each of which is filled with a powdery mixture 24 of various vitreous oxides. Later, laser beams are locally irradiated only on the proximity of the mesa grooves 22 having a width of 300 to 500 microns, thereby forming a glass passivation layer.

As seen from the oblique view of FIG. 2, laser beams are emitted from a $CO_2$ gas laser. The laser beams are irradiated on a wafer 10 placed on a heating board 28 at 300° to 500° C. in an inert atmosphere, for example, $N_2$ gas. Laser beams scan the lattice-shaped mesa grooves 22 formed in the wafer 10.

The annealing process based on the application of laser beams has drawbacks. If a large amount of radiation from $CO_2$ gas laser beams is applied, the glass material is overheated to a red hot state; on the other hand, the $CO_2$ gas laser beams permeate a silicon semiconductor substrate, preventing its temperature from rising; therefore, the glass does not wet to the semiconductor substrate, but shrinks and peels off.

To resolve the above-mentioned difficulties, it may be advised to apply a reduced amount of radiation from laser beams and slowly bake the silicon substrate. This process lets the silicon substrate absorb the heat of the glass material, causing the temperature of the silicon substrate to rise to a sufficiently high level to allow the glass material to wet to the silicon substrate, and consequently avoiding the occurrence of the aforementioned drawbacks. Nevertheless, the proposed process still suffers from the disadvantage that the $CO_2$ gas laser has to be applied for a considerably long time.

The process of depositing a glass passivation layer by applying laser beams is already disclosed in a Japanese patent publication No. 55-36,184 and a Japanese laid-open patent application No. 51-151,071. The Japanese laid-open patent application sets forth a process of applying a single kind of laser beams. The Japanese patent publication No. 55-36,184 indicates a process of applying two kinds of laser beams. In the latter process, one kind of laser beams is used to bake a glass material and the other kind of laser beams is applied in scribing the semiconductor substrate.

SUMMARY OF THE INVENTION

It is accordingly the object of this invention to provide a method of manufacturing a glass passivation semiconductor device, which, even when a large amount of laser beams is applied, enables a glass protective material mounted on the surface of a semiconductor junction to melt and wet thereto, thereby providing a perfect glass protective layer.

To attain the above-mentioned object, this invention provides a method which comprises the step of simultaneously irradiating first laser beams substantially absorbed in glass and second laser beams substantially absorbed in a semiconductor substrate on that part of the semiconductor substrate on which a glass protective material is deposited, thereby forming a glass passivation layer.

With a glass passivation semiconductor device thus constructed, first laser beams heat the glass material, and second laser beams heat a semiconductor substrate, thereby assuring the good wetting of the glass material to the semiconductor substrate.

BRIEF DESCRIPTION OF THE DRAWINGS

Other objects and advantages of this invention will become apparent from a following description taken in connection with the accompanying drawings in which.

DETAILED DESCRIPTION OF THE PREFERRED EMBODIMENT

Figure 1:
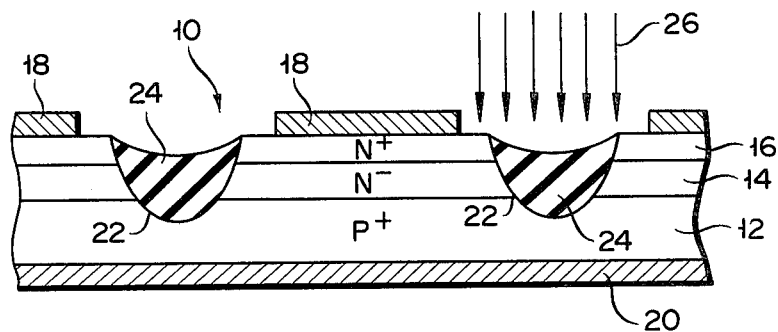
FIG. 1 is a cross sectional view of a semiconductor wafer, illustrating the conventional method of manufacturing a glass passivation semiconductor device.
Figure 2:
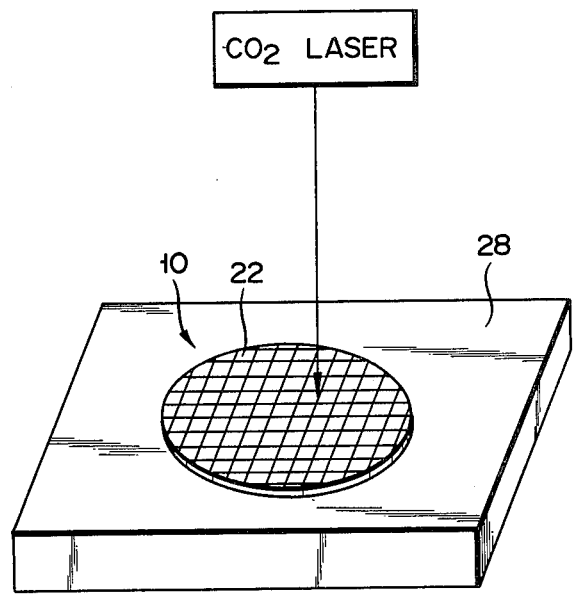
FIG. 2 is an oblique view of a semiconductor wafer which is provided with lattice-shaped mesa grooves, illustrating the manner in which the conventional laser beams are irradiated on the mesa grooves.
Figure 3A:
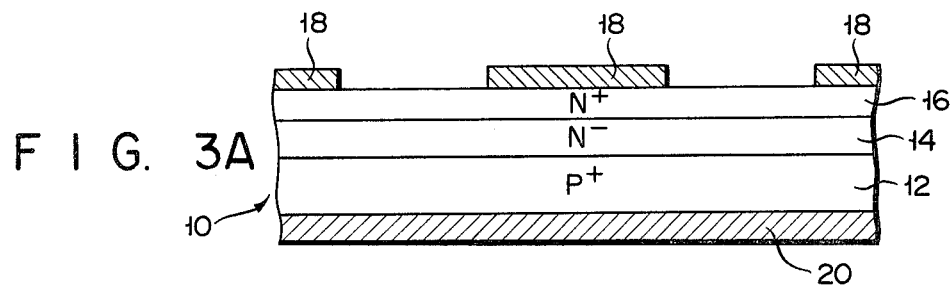
FIGS. 3A to 3D are the cross sectional views of a semiconductor wafer, illustrating the sequential steps of manufacturing a glass passivation semiconductor device embodying this invention.
Figure 3B:
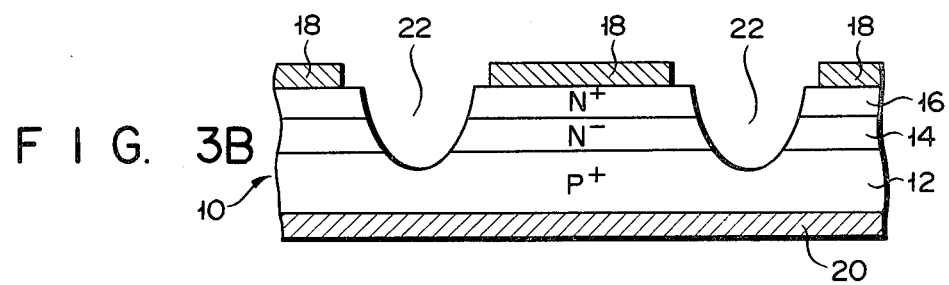
Figure 3C:
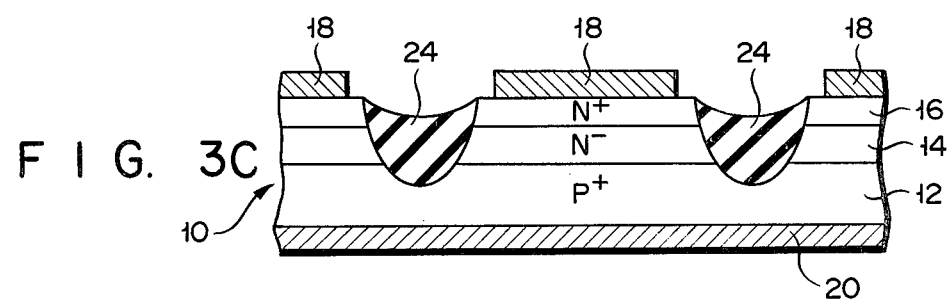

Description is now given with reference to FIGS. 3A to 3D and FIG. 4 of a method of manufacturing a glass passivation semiconductor device embodying this invention. As shown in FIG. 3A, metal electrodes 18 and a metal electrode 20 are respectively mounted on opposite sides of a silicon wafer 10 prepared from a P+ layer 12, N− layer 14 and N+ layer 16. The metal electrodes 18 act as the cathodes of a diode, and the metal electrode 20 acts as the anode of a diode. Later, the silicon wafer 10 is subjected to mesa etching to form mesa grooves 22 shown in FIG. 3B. A powdery mixture 24 of various vitreous oxides is deposited in the mesa grooves 22 (FIG. 3C). The composite glass material well serves the purpose, provided it is of the type applied for protection of the surface of a semiconductor junction. The composite glass material is prepared from a mixture of, for example, $PbO-B_2O_3-SiO_2$, $ZnO-B_2O_3-SiO_2$, $PbOB_2O_3-SiO_2-Al_2O_3$ or a mixture of, for example, $B_2O_3$, $Al_2O_3$, $SiO_2$, $ZnO$ and $PbO$. The powdery mixture of the vitreous oxides is deposited on the surface of a semiconductor junction by the steps of dispersing a powdery mixture of vitreous oxides whose particle size measures less than 1 micron in an organic solvent in the suspended form and depositing the suspension on the surfaces of the junctions of the mesa grooves by precipitation, printing, electrophoresis or by means of a doctor blade. Thereafter, the vitreous mixture is attached to the surface of the semiconductor junction by being dried at a temperature of about 300° C.

Figure 3D:
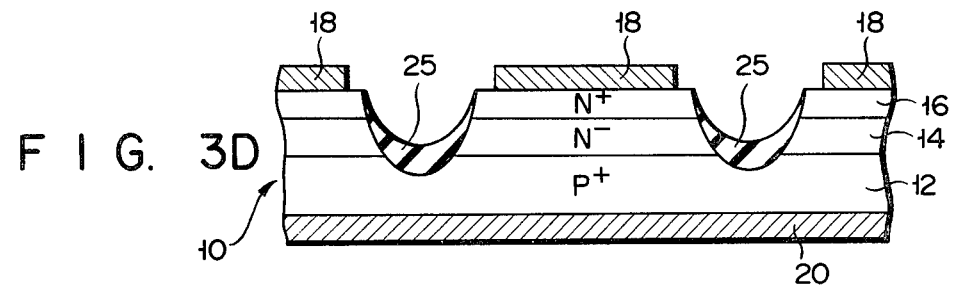
Figure 4:
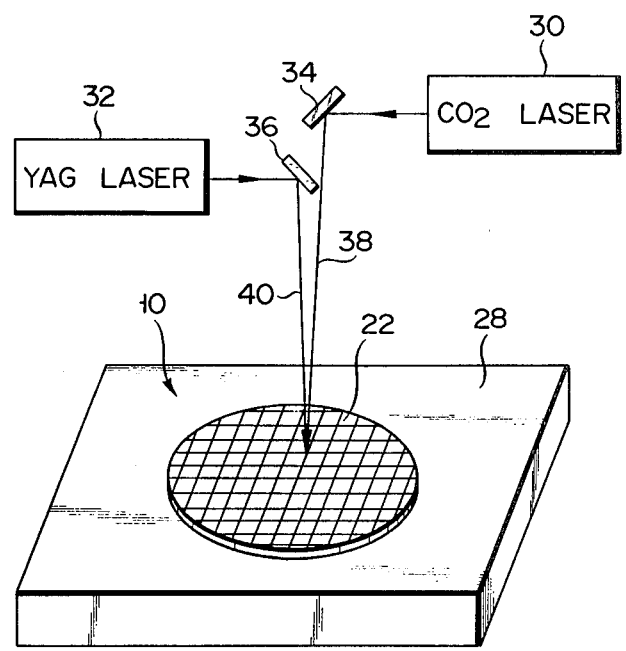
FIG. 4 is an oblique view of a semiconductor wafer which is provided with lattice-shaped mesa grooves, illustrating the manner in which laser beams are irradiated on the mesa grooves in accordance with the method of the invention.

Later as shown in FIG. 4, the vitreous mixture is sintered by applying two kinds of laser beams to provide glass passivation layers (FIG. 3D). One kind of laser beams is generated from a $CO_2$ gas laser 30 with a wavelength of 10.6 microns, and is substantially absorbed in the composite glass material. The other kind of laser beams emanates from a YAG ($Y_3Al_5O_{12}$) laser 32 doped with $Nd^{3+}$ with a wavelength of about 1 micron, and are well absorbed in the silicon substrate. The semiconductor wafer 10 is put on a heating board and kept at a temperature of 300° to 500° C. This step is intended to prevent a wafer locally heated by laser beams from being split by thermal stress.

The two kinds of laser beams 38, 40, having different wavelengths, have their paths diverted by the corresponding mirrors 34, 36 (FIG. 4). The laser beams 38, 40 whose paths have thus been diverted are simultaneously irradiated onto the glass protective material residing in the mesa grooves 22. Where the glass protective material is in powdery form, then the YAG laser beams are not absorbed in the glass protective material, nor reach the semiconductor substrate by being scattered. Where the glass protective material is melted by the $CO_2$ gas laser, then the YAG laser beams immediately permeate the molten glass material to locally heat a boundary between the glass protective material and the silicon substrate. Since, at this time, the temperature of the silicon substrate is raised, wetting takes place between the molten glass and the silicon substrate. At this time the laser beams scan the lattice-shaped mesa grooves 22 formed in the wafer 10.

The laser beams need not be limited to the type used in the foregoing embodiment. For instance, the YAG laser beams may be replaced by Ar laser beams. Further, it is possible to apply laser beams which are emitted with a continuous wavelength and have a large coefficient of absorption in the semiconductor substrate. The $CO_2$ gas laser beams well serve the purpose, provided they have such a wavelength as enables them to be readily absorbed in one glass material to raise its temperature. The amount of radiation needed from the respective laser beams is defined by the temperature to which an object of their irradiation is to be heated.

The mesa grooves were conventionally baked only for 2 to several seconds by beams emitted from a 70 W $CO_2$ gas laser, and thus the heated glass protective material did not wet to a silicon substrate, but shrank into a spherical form by being repulsed from the silicon substrate.

In contrast, where $CO_2$ gas laser beams and YAG laser beams are jointly used in accordance with this invention, then the temperature of a boundary between the glass protective material and the semiconductor substrate is increased in temperature, as soon as the glass protective material is melted. Since, at this time, wetting takes place between the glass protective material and the semiconductor substrate, a protective layer can be satisfactorily formed by irradiating the above-mentioned two kinds of laser beams for a short length of time, thereby reducing the cost of producing a glass passivation semiconductor device.

What we claim is:

1. A method of manufacturing a glass passivation semiconductor device having a semiconductor wafer, comprising the steps of:
    mesa etching the semiconductor wafer to provide a mesa groove on the surface of the semiconductor wafer, a surface of said mesa groove having an end portion of a PN junction;
    depositing a glass protective material in a powdery form on the surface of said mesa groove;
    simultaneously radiating first and second laser beams onto said glass protective material, said first laser beam having a wavelength which is substantially absorbed in said glass protective material to melt said glass protective material, said second laser beam having a wavelength which is substantially absorbed in said semiconductor wafer and penetrates said melted glass protective material to heat the semiconductor surface of said mesa groove sufficiently for wetting said melted glass protective material to the semiconductor wafer.

2. The method according to claim 1, wherein the semiconductor substrate is formed of silicon; first laser beams are irradiated by a $CO_2$ gas laser; and second laser beams are emitted by a YAG laser.

3. The method according to claim 1 or 2, wherein the semiconductor substrate is preheated to a temperature of 300° to 500° C. before irradiation of the laser beams; and the laser beams are irradiated in an atmosphere of an inert gas.

4. A method of manufacturing a glass passivation semiconductor device having a semiconductor wafer, comprising the steps of:
    mesa etching the semiconductor wafer to provide a mesa groove on the surface of the semiconductor wafer, a surface of said mesa groove having an end portion of a PN junction;
    depositing a glass protective material in a powdery form on the surface of said mesa groove; and
    wetting said glass protective material to the semiconductor wafer by simultaneously radiating first and second laser beams onto said glass protective material, said first laser beam having a wavelength which is substantially absorbed in said glass protective material to melt said glass protective material, said second laser beam having a wavelength which is substantially absorbed in said semiconductor wafer and penetrates said melted glass protective material to heat the semiconductor surface of said mesa groove.

* * * * *